United States Patent
O

(10) Patent No.: US 8,119,967 B2
(45) Date of Patent: Feb. 21, 2012

(54) SEMICONDUCTOR IMAGE SENSOR ARRAY DEVICE, APPARATUS COMPRISING SUCH A DEVICE AND METHOD FOR OPERATING SUCH A DEVICE

(75) Inventor: Nixon O, Brampton (CA)

(73) Assignee: Teledyne DALSA, Inc., Waterloo (CA)

( * ) Notice: Subject to any disclaimer, the term of this patent is extended or adjusted under 35 U.S.C. 154(b) by 407 days.

(21) Appl. No.: 12/378,236

(22) Filed: Feb. 13, 2009

(65) Prior Publication Data

US 2009/0190019 A1      Jul. 30, 2009

Related U.S. Application Data

(62) Division of application No. 11/806,605, filed on Jun. 1, 2007, now abandoned.

(51) Int. Cl.
*H01L 27/00* (2006.01)
*H04N 1/387* (2006.01)

(52) U.S. Cl. ..................... 250/208.1; 358/452

(58) Field of Classification Search ............... 250/208.1, 250/214 R; 348/308, 241; 257/233, 291–294; 358/443, 452, 453

See application file for complete search history.

(56) References Cited

U.S. PATENT DOCUMENTS

| | | |
|---|---|---|
| 6,107,655 A | 8/2000 | Guidash |
| 6,160,281 A | 12/2000 | Guidash |
| 6,218,656 B1 | 4/2001 | Guidash |
| 6,289,139 B1 | 9/2001 | Chen et al. |
| 6,395,576 B1 | 5/2002 | Chang et al. |
| 6,507,011 B2 | 1/2003 | Ang |
| 6,596,979 B2 | 7/2003 | Hou |
| 6,657,665 B1 | 12/2003 | Guidash |
| 6,734,906 B1 | 5/2004 | Hashimoto |
| 6,878,918 B2 | 4/2005 | Dosluoglu |
| 7,034,273 B1 | 4/2006 | O |
| 7,244,918 B2 | 7/2007 | McKee et al. |
| 7,382,010 B2 | 6/2008 | Choi |
| 7,443,437 B2 | 10/2008 | Altice et al. |
| 2003/0112351 A1 | 6/2003 | Clark |
| 2005/0128327 A1 | 6/2005 | Bencuya et al. |

FOREIGN PATENT DOCUMENTS

DE      10313250 A1      1/2004

*Primary Examiner* — Georgia Y Epps
*Assistant Examiner* — Renee Naphas
(74) *Attorney, Agent, or Firm* — Fisher Technology Law PLLC

(57) ABSTRACT

A method of using a line-scan sensor device to scan an image includes determining and removing. The device includes sensor cells arranged in a matrix of rows and columns. The determining includes determining when a pixel signal value from a pixel in a first row and in a column deviates from a pixel signal value from a pixel in a second row and in said column. The removing includes removing the pixel signal value of the pixel in the first row and in said column when the pixel signal value from the pixel in the first row and in said column deviates from the pixel signal value from the pixel in the second row and in said column. The pixel in the first row and in said column images a portion of the image and the pixel in the second row and in said column images the same portion of the image.

6 Claims, 4 Drawing Sheets

SEMICONDUCTOR IMAGE SENSOR ARRAY DEVICE, APPARATUS COMPRISING SUCH A DEVICE AND METHOD FOR OPERATING SUCH A DEVICE

This application is a divisional application of, and claims priority from, U.S. Ser. No. 11/806,605 filed Jun. 1, 2007 now abandoned.

BACKGROUND OF THE INVENTION

The invention relates to a plural-line CMOS semiconductor image sensor array device provided with sensor cells arranged in a matrix of coordinate-wise rows and columns, each cell comprising a photosensitive area, an output node, and a transfer gate for selectively interconnecting the photosensitive area and the output node.

Such sensor arrays will represent useful tools for various types of imaging purposes, such as medical, hand-held telephone, surveyance and various others. Basically, there are two prime technologies, CCD and CMOS. Although both have particular pluses, the present invention focuses on CMOS cells. In particular, CMOS has a markedly lower noise potential for high-speed imaging. Furthermore, CMOS does not necessitate a noise versus bandwidth trade-off, since there can be multiple low-speed analog signal chains provided within a single CMOS die. It is to be noted that in this application CMOS means (C)MOS which implies that the semiconductor imaging sensor array device is based on CMOS (=Complimentary Metal Oxide Semiconductor) technology or on NMOS technology or on PMOS technology. In CMOS technology, which relates to the preferred embodiments, both NMOS and PMOS technology is used.

The present invention provides various aspects of use for plural-line sensor by having neighboring cell rows and columns lying close together without intervening gap strips other than necessary for electronic separation between neighbor rows and columns. By providing a limited amount of control circuitry within the cell area, flexibility of control will greatly be enhanced. This local circuitry may advantageously be combined with overall control facilities and/or separate data connections for the cells.

Furthermore, the invention does away with geometrical shift (notably a horizontal half pixel shift) between one array row and its next neighbor inasmuch as the present format would allow for various advantages both in design and operating of the array By itself, U.S. Pat. No. 6,566,697 B1 published May 20, 2003, that shares one inventor with the present patent application and has been assigned to the present Assignee, discloses a PINNED PHOTODIODE FIVE TRANSISTOR PIXEL that can be used as a pixel building block for the present arrangement. In view of the prior art's extensive circuitry disclosure, the present text will consider most electronic signal aspects as being obvious to persons of average skill in the CMOS design art.

Furthermore, US Publication 2006/0284177 A1 published on Dec. 21, 2006, discloses a solid state image sensor with row-shared photodiodes. The present invention allows for a raised flexibility.

SUMMARY TO THE INVENTION

In consequence, amongst other things, it is an object of the present invention to configure an array device as recited in order to allow executing various different operating modes through measures that are taken inside or proximate to the array.

Now therefore, the invention is characterized in that the mirror symmetry aspect pertains to the position of the output node. Regarding various design considerations, the orientation of the transfer gates, and/or the detailed shape of the output node area can have some deviation from exact mirror symmetry. Generally control parts are concentrated in a corner area of the pixel. This allows for sharing various elements among neighboring pixels.

Advantageously, transfer gates pertaining to output nodes so facing each other are arranged for being either collectively actuated or, alternatively, for being actuated odd gates mutually exclusive with respect to even gates, and vice versa. For one, this allows for separate control between odd and even rows of a multi-row array.

Advantageously, also in a second coordinate direction adjacent cells are functionally configured as mutually mirror-symmetric structures in that their proximate output nodes are facing each other and all such facing output nodes are separately feeding a respective column-directed output channel. The same geometrical caution as above applies also here, but the design and operation of the array will be facilitated appreciably. One aspect of the control would pertain to so-called binning, wherein signals of adjacent cells are joined to apparently produce a larger cell area. Although the combining of two cells will only lead to a √2 improvement in dynamic range, the disadvantage of this relatively weaker improvement can be offset by the lower noise potential of CMOS for high speed imaging.

Advantageously, also in said second coordinate direction odd and even transfer gates are arranged for being either collectively actuated or, alternatively actuated odd gates mutually exclusive with respect to even gates, and vice versa. This completes a set of operational modes, in particular the discriminating between various pixel rows.

The invention also relates to an apparatus comprising a sensor array device as recited supra and to a method for operating such sensor array device. Persons skilled in the art will from the disclosure herein readily grasp implementations for such use of the inventive principle. Further advantageous aspects of the invention are recited in dependent Claims.

Particular advantageous aspects of CMOS technology as compared with CCD technology for line scan application are:
  Higher line rate with a larger number of pixels
  Higher line rate with a dual linescan structure
  Closer spatial separation between colors
  For a given line rate, lower noise is expected to be attained
  Particular advantageous aspects of the architecture herein are as follows:
  Instead of one line of pixels in a linescan, use plural linescans, especially two or four; some highly specialized arrays could use eight lines, although this number is not an express limitation; the prime usage is expected for four-line arrays; in particular, plural lines can scan the image multiple times, which results in a better signal to noise ratio
  Independent global shutter for each line of pixels
  Adjacent pixels can be binned in a 2×2 format
  Minimized crosstalk between lines
  From a control point of view, the following advantageous aspects apply:
  The exposure control gate controls the start of the integration time
  The transfer gate controls the end of the integration time All pixels in the same row have exposure control and transfer gates connected together Different rows have different exposure control and transfer gates The arrangement allows independent row-to-row control of integration start and end times Binning gates can be used to select between 2×2 binning or no-binning modes

BRIEF DESCRIPTION OF THE DRAWING

These and further features, aspects and advantages of the invention will be discussed more in detail hereinafter with reference to the disclosure of preferred embodiments of the invention, and in particular with reference to the appended Figures that illustrate.

DETAILED DESCRIPTION OF PREFERRED EMBODIMENTS

Figure 1:
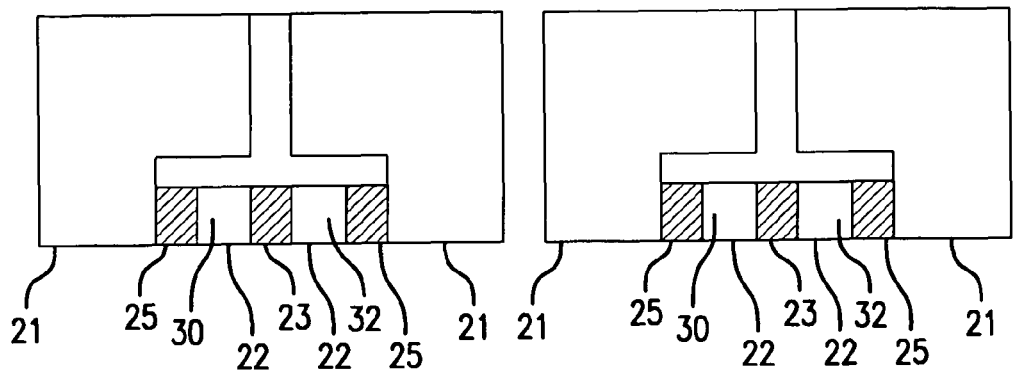
FIG. 1, a single row of sensor cells, wherein odd cells have their readout nodes at lower right, and even cells have their readout nodes at lower left.

FIG. 1 illustrates a single row of sensor cells, wherein odd cells have their readout nodes at lower right, and even cells have their readout nodes at lower left. Generally, odd and even neighbor cells are mirror symmetric. In the arrangement shown, photosites 21 cover relatively the greatest part of the cell area. They are connected by means of transfer gates 25 to readout nodes 22. Each readout node 22 is connected through a respective output channel 30, 32 to an output facility of the sensor cell array. Finally, item 23 represents the binning gates that allow to combine the output signals of the left and right sensor cell pairs in the Figure. For simplicity, functionally corresponding elements carry corresponding reference numerals throughout the disclosure. The arrangement can be modified to some extent. For example, some or all transfer gates 25 may connect Northward in the Figure instead of East or West. This could also be combined with a slightly different form of either photosites and/or output nodes. Even so, the overall geometry of the cells has an odd/even mirror symmetry character. Expressly through providing this symmetry, the joining and/or selecting of control facilities and data connections will be made possible. A plural line sensor array cell device can now be produced by repeating the cell rows shown in FIG. 1 as many times as considered feasible. A preferred embodiment will however be disclosed with respect to the further Figures hereinafter. Note that pixels are represented as square areas. However, they could be rectangular with unequal sides.

Figure 2:
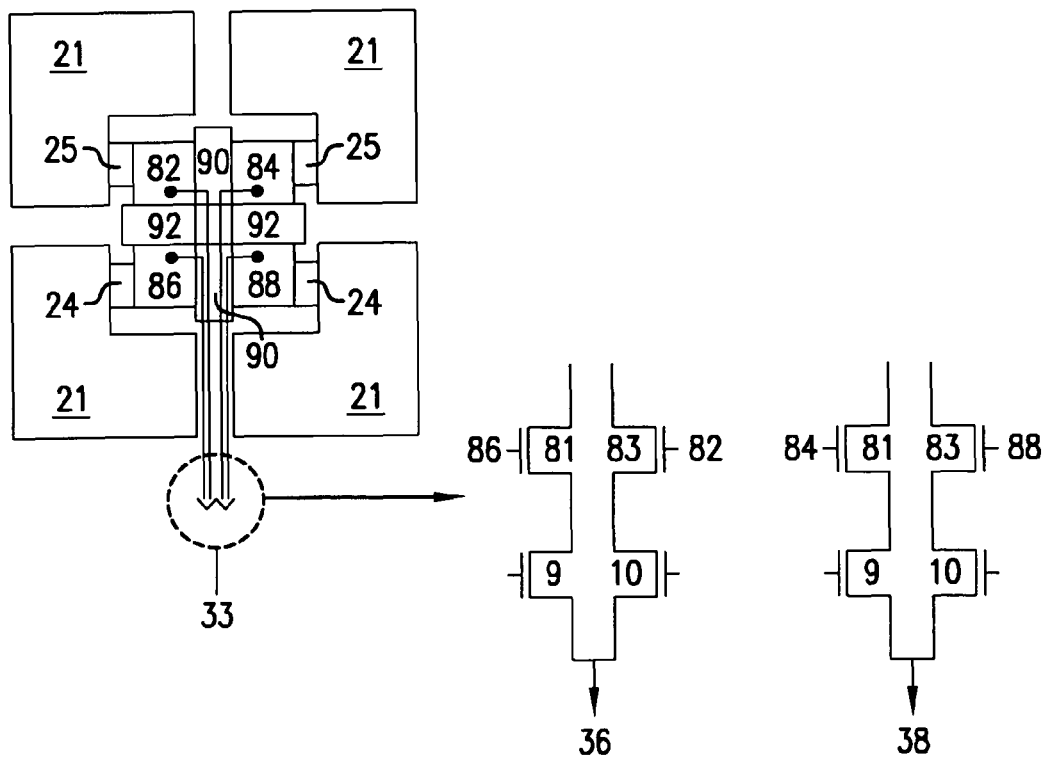
FIG. 2, an arrangement of four adjacent sensor cells in two rows and two columns.

FIG. 2, illustrates an arrangement of four adjacent sensor cells in two rows and two columns. The upper two cells substantially repeat the arrangement of FIG. 1. The lower two cells are in mirror symmetry both with each other and also with the upper two cells, with similar caution as discussed with regards to FIG. 1. Additionally, the lower two cells have transfer gates 24: through separate control among output gate pairs 24, 25 either the bottom row or the top row can be controlled separately, or rather combined. Each of the four output nodes 82, 84, 86, 88 feeds a separate output lead running down-wards in the Figure towards circle area 34. For clarity, the content of this circle area 34 has been shown in an enlarged manner at lower right. The output nodes are each connected to amplifier source follower FETs 81 and 83. The enabling of MOS gates 9 will connect the signals from the bottom row of cells to the analog chains 36 and 38, whereas the enabling of MOS gates 10 will connect the signals from the top row of cells. Finally, item 90 represents binning gates that allow to combine the output signals of the left and right sensor cell pairs in the Figure. Likewise, item 92 represents binning gates that allow to combine the output signals of the upper and lower sensor cell pairs in the Figure. Therefore, the control arrangement as shown allows to output either separate cells of the upper versus the lower row, the separate combining of left and right column, respectively, or the combined outputting of all four cells.

Note that amplifier FETs 81 and 83 and row switch gates 9 and 10 can be located in the pixel itself, along with an associated amplifier not shown for brevity. In a device drawing for IC processing, they could fit between the binning gates (23), but also in the middle of the Figure. The row switch gates and the amplifier do need be laid out with any symmetry restrictions.

Figure 3:
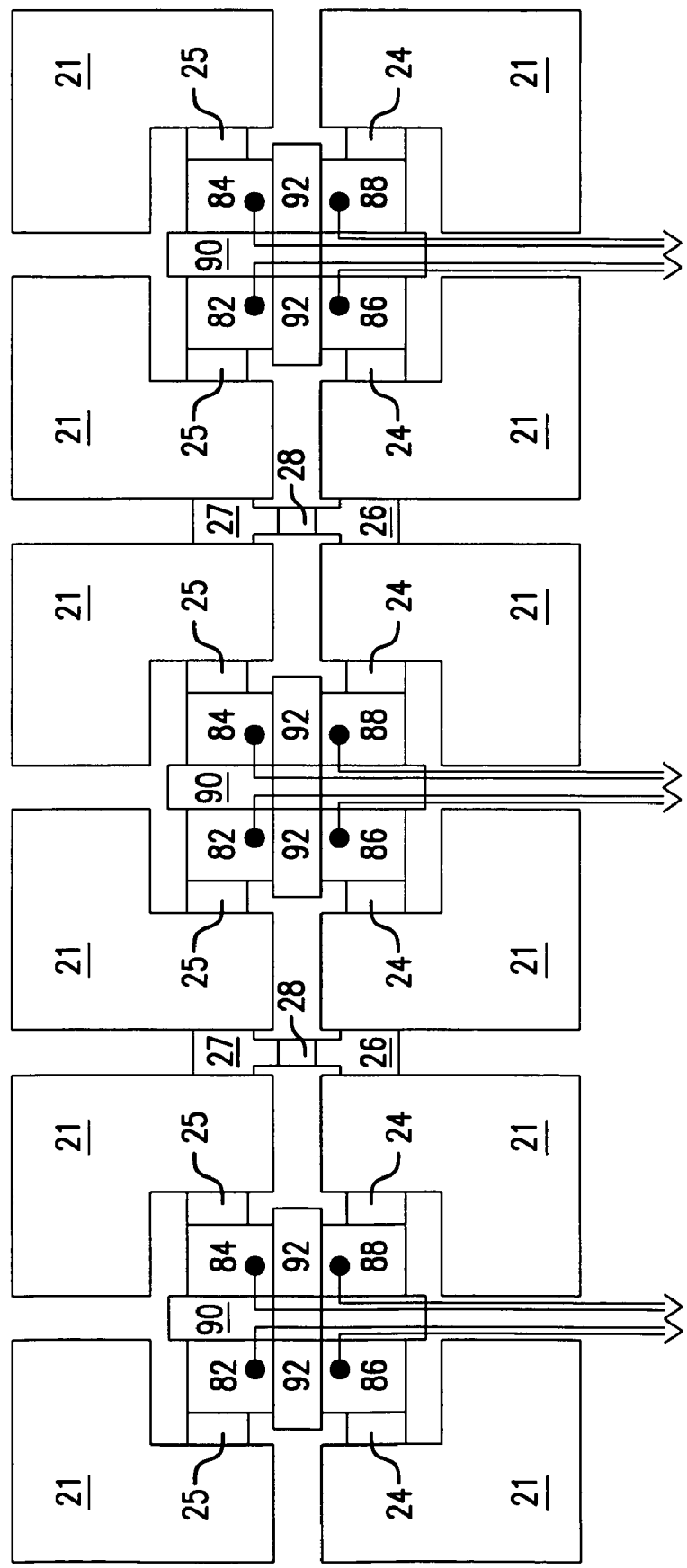
FIG. 3, row-wise successive blocks of four adjacent sensor cells.

FIG. 3 illustrate row-wise successive blocks each of four adjacent sensor cells. Next to the features shown in FIG. 2, and whilst suppressing the output facilities 9, 10, 36 and 38, 81, 83, items 26 and 27 represent the exposure control gates for the lower and upper rows, respectively. Finally, items 28 represent the exposure control's drain electrodes. For clarity, the control and powering connections for various gates have not been shown particularly. Indeed, persons skilled in the art of integrated circuit CMOS design will readily conceive appropriate layouts for such connections.

Figure 4:
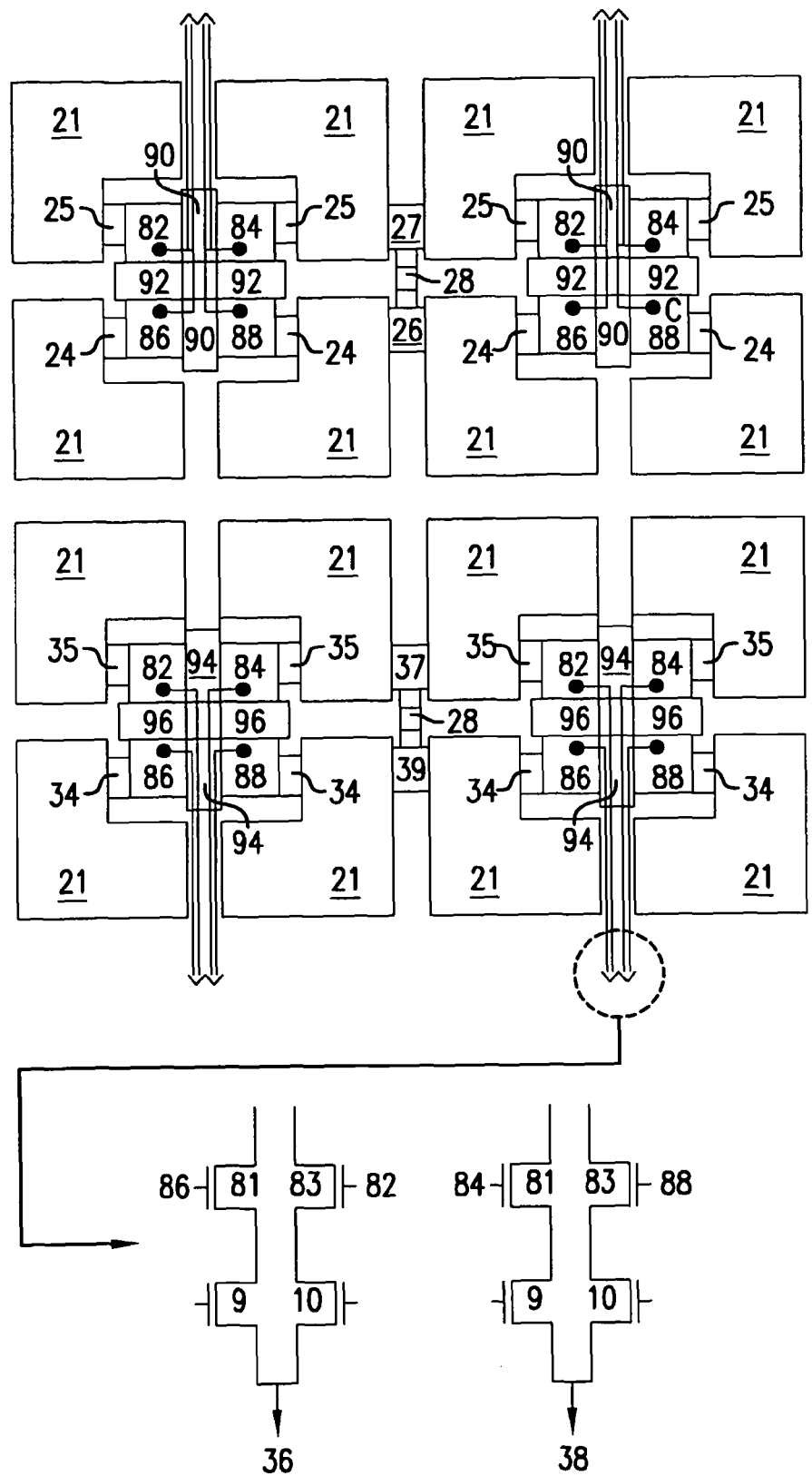
FIG. 4, a block-wise arrangement of 4×4 cells.

FIG. 4 illustrates a block-wise arrangement of 4×4 cells. Largely, the layout is in mirror symmetry between the upper two and lower two rows of cells. The upper two rows will output to the upper side of the arrangement and the power two rows ditto to the lower side. The combining or binning gates 90, 92, 94 and 96; the transfer gates 24, 25, 34 and 35; and the exposure control gates 26, 27, 37 and 39 are separate from each other for the upper and lower row pairs, respectively.

Hereinafter, various applications for the arrangements, supra, will be discussed. Generally, the prime layout will have four rows of cells; for particular applications, eight rows of cells may be useful, taking into account that a raised number of output lines (for example, 36 and 38 in FIG. 2) will mean additional substrate area required for these lines and therefore, a smaller available area for light collection.

Figure 5:
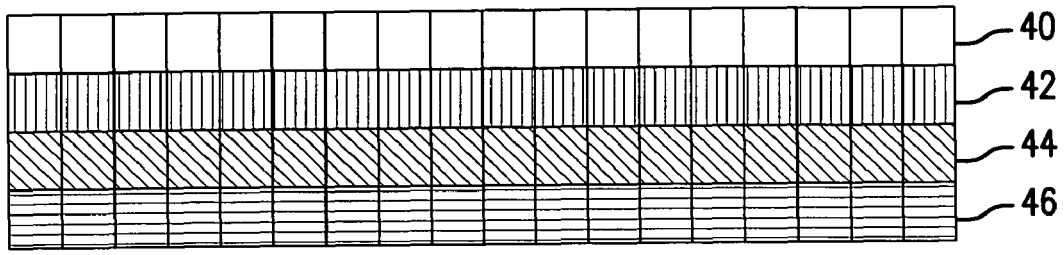
FIG. 5, an arrangement for use as a color linescan only.

Now, FIG. 5 illustrates an arrangement for use as a color linescan only. If this is the only envisaged field of use, each of the four rows 40, 42, 44, 46 may get its own spectral filter as symbolized with a respective different shading level. This feature allows RGB and monochrome readout independently. Advantageously over CCD technology, this design allows close spacing between colors and generates low noise at high line rates.

Other filter patterns can be considered as well, next to having each row assigned to a particular single color. For example, each row can have a uniformly rotating spectral sequence, such as red-blue-green-red-blue-green, etcetera. Various pattern recipes have been produced in literature.

Figure 6:
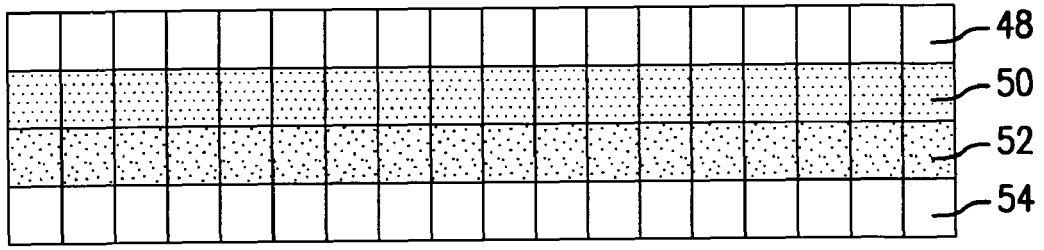
FIG. 6, a high-resolution small pixel arrangement.

FIG. 6 illustrates a high-resolution small pixel arrangement. One scheme involves the readout of top and bottom lines 48 and 54 only (light shading) whilst discarding the remainder two lines 50 and 52. By way of refinement, fault correction can be effected as follows. If one of the pixels is corrupted by background radiation or otherwise, it can be replaced by the other pixel (row 4 cell replacing row 1 cell and vice versa). Contrariwise, if neither pixel is corrupted, combining their two signals by averaging will provide a √2 increase in dynamic range. The above feature of correcting does not require a rescan and in therefore both simple and fast. Neither would a redundant sensor be required. Both alternatives would be relatively expensive.

Figure 7:
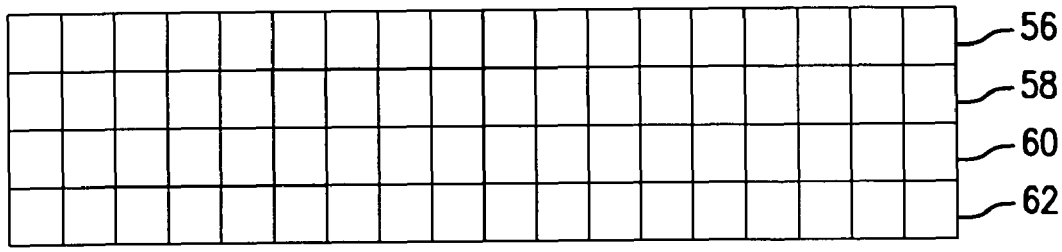
FIG. 7, a further high-resolution small pixel arrangement.

FIG. 7 illustrates a further high-resolution small pixel arrangement. Here, all four cell rows 56, 58, 60, 62 are used. Moreover, with greater camera complexity the usage, i.e. the combining of all four rows allows a 2 times increase in dynamic signal range.

Figure 8:
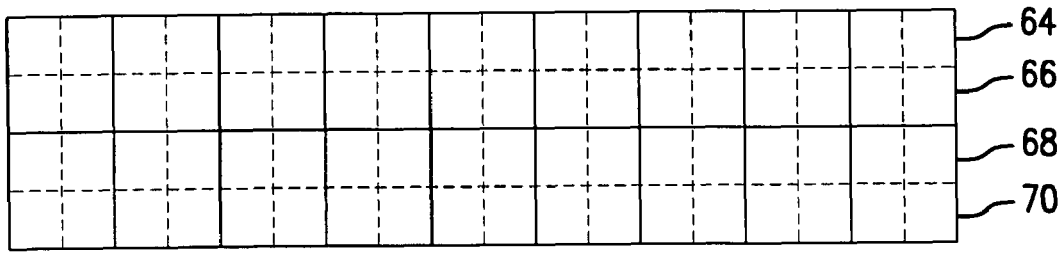
FIG. 8, a low-resolution large pixel arrangement.

FIG. 8 illustrates a low-resolution large pixel arrangement with four lines 64, 66, 68, 70. Various organizations are feasible. The first is binning by four 2×2 pixels for a two times linear increase of pixel size. Binning is useful in situations when the imaging system requires a larger pixel to collect more light from the object, or when a faster scan through the readout of fewer pixels is required. Another field of use is to treat two binned rows as dual linescans for a √2 times increased dynamic range. In addition, the low noise and high line rate of CMOS will produce at least a like quality level as compared to CCD.

Hereinafter, various policies will be described for improving signal quality when influenced adversely by one or more of background radiation, other random background events evolving outside the sensor die, such as electrical glitch or magnetic interference, deviations through internal defects and events within the sensor physical structure, and various others. The effect of such defects on a particular signal can be pixels that are wholly or partially unresponsive, pixels with a dark signal, highly non-linear pixels, or pixels with much noise or electrical instability.

One method to mend such is by checking a pixel signal with all or part of the other signals in its proper column. If the deviation is considered spurious, the pixel is removed. Against random noise events, a certain column-wise averaging will reduce such effects. Non-ideal defects in the internal die structure can depend on developing an expected performance metric and rejecting pixels that deviate too much from the metric in question. Examples of such metric are the average, mean, minimum, maximum, or any low-pass filtered derivation from the pixel signals of the same column. Furthermore, admitted, i.e. non-rejected pixels can be subjected to low-pass filtering, such as averaging to reduce random noise.

Now, the present invention has hereabove been disclosed with reference to preferred embodiments thereof. Persons skilled in the art will recognize that numerous modifications and changes may be made thereto without exceeding the scope of the appended Claims. In consequence, the embodiments should be considered as being illustrative, and no restriction should be construed from those embodiments, other than as have been recited in the Claims.

What is claimed is:

1. A method of using a line-scan sensor device to scan an image, the device comprising sensor cells arranged in a matrix of rows and columns, the method comprising:

determining when a pixel signal value from a pixel in a first row and in a column deviates from a pixel signal value from a pixel in a second row and in said column; and removing the pixel signal value of the pixel in the first row and in said column when the pixel signal value from the pixel in the first row and in said column deviates from the pixel signal value from the pixel in the second row and in said column, wherein the pixel in the first row and in said column images a portion of the image and the pixel in the second row and in said column images the same portion of the image.

2. A method of using a plural-line image sensor device according to claim 1, the method further comprising replacing the pixel signal value of the pixel in the first row and in said column with a column-wise filtered pixel signal value comprised of the pixel signal value from the pixel in the second row and in said column.

3. A sensor comprising:

a plural-line image sensor device operable to scan an image, the device comprising sensor cells arranged in a matrix of rows and columns; and a processor operable to determine when a pixel signal value from a pixel in a first row and in a column deviates from a pixel signal value from a pixel in a second row and in said column, and to remove the pixel signal value of the pixel in the first row and in said column when the pixel signal value from the pixel in the first row and in said column deviates from the pixel signal value from the pixel in the second row and in said column, wherein the pixel in the first row and in said column images a portion of the image and the pixel in the second row and in said column images the same portion of the image.

4. A sensor according to claim 3, wherein the processor is further operable to replace the pixel signal value of the pixel in the first row and in said column with a column-wise filtered pixel signal value comprised of the pixel signal value from the pixel in the second row and in said column.

5. A processor readable medium comprising plural modules for controlling a processor, the modules comprising:

a module operable to control the processor to determine when a pixel signal value from a pixel in a first row and in a column of a plural-line image sensor device operable to scan an image deviates from a pixel signal value from a pixel in a second row and in said column; and a module operable to control the processor to remove the pixel signal value of the pixel in the first row and in said column when the pixel signal value from the pixel in the first row and in said column deviates from the pixel signal value from the pixel in the second row and in said column, wherein the pixel in the first row and in said column images a portion of the image and the pixel in the second row and in said column images the same portion of the image.

6. A processor readable medium according to claim 5, wherein the modules further comprise a module operable to control the processor to replace the pixel signal value of the pixel in the first row and in said column with a column-wise filtered pixel signal value comprised of the pixel signal value from the pixel in the second row and in said column.

* * * * *